United States Patent [19]

Lee et al.

[11] Patent Number: 5,024,961
[45] Date of Patent: Jun. 18, 1991

[54] BLANKET PUNCHTHROUGH AND FIELD-ISOLATION IMPLANT FOR SUB-MICRON N-CHANNEL CMOS DEVICES

[75] Inventors: Ruojia Lee; Aftab A. Ahmad, both of Boise, Id.

[73] Assignee: Micron Technology, Inc., Boise, Id.

[21] Appl. No.: 550,000

[22] Filed: Jul. 9, 1990

[51] Int. Cl.[5] .............................. H01L 21/265
[52] U.S. Cl. ................................ 437/34; 437/57; 437/70; 148/DIG. 18
[58] Field of Search .................. 437/34, 56, 57, 69, 437/70; 357/42

[56] References Cited

U.S. PATENT DOCUMENTS 4,717,683  1/1988  Parrillo et al. ..................... 437/34
4,839,301  6/1989  Lee ................................... 437/70

Primary Examiner—Olik Chaudhuri
Assistant Examiner—Long Pham
Attorney, Agent, or Firm—Angus C. Fox, III

[57] ABSTRACT

A blanket boron implant that functions as both a punchthrough and field-isolation implant for sub-micron N-channel CMOS devices. The boron impurity is implanted with high energy subsequent to field oxide growth in order to position the impurity below the field oxide regions and below the future channel region of the N-channel devices. In order to avoid significant counter-doping of the substrate in the N-well regions, the phosphorus dosage during the N-well implant is at a much higher dosage level than the dosage level used for the punchthrough/field isolation implant.

6 Claims, 8 Drawing Sheets

BLANKET PUNCHTHROUGH AND FIELD-ISOLATION IMPLANT FOR SUB-MICRON N-CHANNEL CMOS DEVICES

FIELD OF THE INVENTION

This invention relates to semiconductor technology and, more specifically, to punch-through implants used to reduce the short-channel effects in sub-micron CMOS devices.

BACKGROUND OF THE INVENTION

Drain-to-Source punch-through breakdown in MOS transistors occurs due to electric field penetration between the drain and source regions. Punchthrough breakdown generally occurs in the bulk region of the substrate at a level slightly below the depth of the source and drain junctions. Since punch-through breakdown has become one of the primary limiting performance factors in submicron MOS transistors, numerous techniques have been developed for suppressing this phenomenon. Deep, high-energy boron implants have been the principal method for controlling the punch-through effect in submicron N-channel MOS transistors. Normally, the deep boron implant is made in the P-well region using a photoresist mask to shield N-well regions. For N-channel devices the higher the concentration of boron in the bulk region, the higher the punch-through breakdown voltage. For P-channel devices, punch-through breakdown generally occurs near the channel surface due to the counter-doping caused by the use of a boron threshold voltage adjustment implant. For CMOS memory applications, P-channel punch-through breakdown is normally not a serious problem because some ninety percent of the transistors in the circuitry are N-channel devices. Consequently, the short-channel effect can be minimized in P-channel devices merely by increasing channel length, without significantly increasing die size.

AT&T Bell Laboratories has developed a process for performing a blanket boron punch-through implant, which eliminates the need for a photoresist mask. Basically, the process involves implanting boron in the presence of a silicon dioxide layer created in a high-temperature steam ambient that is used to protect the newly-created N-well from the subsequent P-well boron implant. Following a high-temperature well-drive step, an additional blanket boron implant is performed for punch-through prevention purposes. Although this process is noteworthy, it does have several disadvantages. Firstly, the silicon dioxide layer must be extremely thick in order to effectively prevent the high-energy boron implant from counter-doping the N-well region. Secondly, since the punch-through implant is performed prior to field oxide growth, the punch-through boron implant will not serve as an effective field isolation implant due to the segregation property of boron. By the segregation property of boron is meant the tendency for boron to migrate to oxide during an oxidation step. Thirdly, the high temperatures required for field oxide growth will cause the narrow profile of the implanted boron impurity to dramatically widen, decreasing its effectiveness as a punch-through implant.

What is needed is a punch-through implant process that combines the benefits of unmasked implants with the feature of accurate implant positioning. In addition, it would be ideal if the punch-through implant could double as a field isolation implant,

SUMMARY OF THE INVENTION

This invention constitutes a process for preparing a silicon substrate for submicron CMOS applications, including a blanket high-energy boron implant that serves as both an N-channel punch-through implant and a field-isolation implant.

The process begins conventionally, with the growth of a first pad oxide layer on the substrate, blanket deposition of a first silicon nitride layer, masking of the first nitride layer in future P-well regions with photoresist, etching away the exposed portions of the first nitride layer, and performing both an N-well phosphorus implant and an arsenic P-channel punch-through implant. Following a photoresist strip, the exposed substrate in the N-well regions is then oxidized in a high-temperature steam ambient creating an N-well oxide mask. Following the stripping of the remaining portion of the first nitride layer, a boron P-well implant is performed, with the N-well oxide mask protecting the N-well region from the P-well implant. Following a high-temperature well drive step, the N-well oxide mask and the first pad oxide layer are etched away. A second pad oxide layer is then thermally grown on the bare substrate, following which a second silicon nitride layer is blanket deposited and masked with photoresist in all regions except where field oxide regions are desired. The portions of the second silicon nitride layer in the future field oxide regions are then etched away. Following a photoresist strip, field oxide regions are grown during a high-temperature step. Finally, a high-energy boron implant is used to create both field isolation regions in the substrate beneath the field oxide regions, in addition to punch-through-resistant regions in the N-channel regions. The original phosphorus dosage in the N-well regions is selected so that the counter-doping that occurs at the time of the unmasked boron field-isolation and punch-through implant does not significantly affect the character of the silicon in the N-well region (i.e., the concentration of phosphorus in the N-well region is far greater than the concentration of boron used during the field-isolation/punch-through implant).

PREFERRED EMBODIMENT OF THE INVENTION

Figure 1:
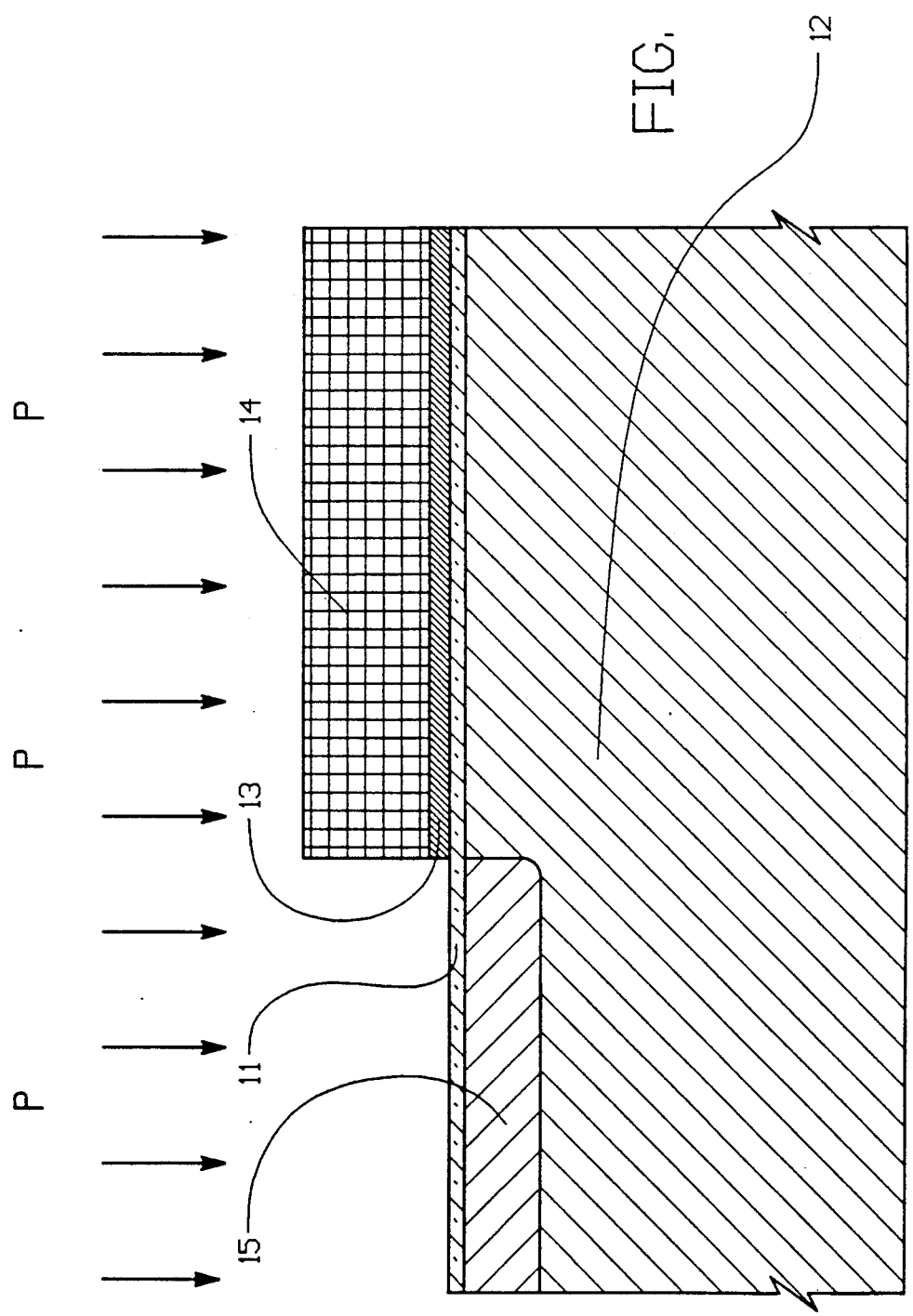
FIG. 1 is a cross-sectional view of a silicon substrate following the growth of a first pad oxide layer, deposition of a first silicon nitride layer, masking of the first silicon nitride layer with photoresist, the etching away of the exposed portions of the first nitride layer, and an N-well phosphorus implant.

Referring now to FIG. 1, which is a cross-section of a portion of a wafer, is shown following thermal growth of a first pad oxide layer 11 on a silicon substrate 12, deposition of a first silicon nitride layer 13, masking of first silicon nitride layer 13 in future P-well regions with a first photoresist mask 14, the etching away of those portions of first nitride layer 13 that are not protected by first mask 14, and an N-well phosphorus implant performed at a dosage level of approximately $12E12/cm^2$, with an energy of approximately 160Kev, which creates an N-well 15 in substrate 12.

Figure 2:
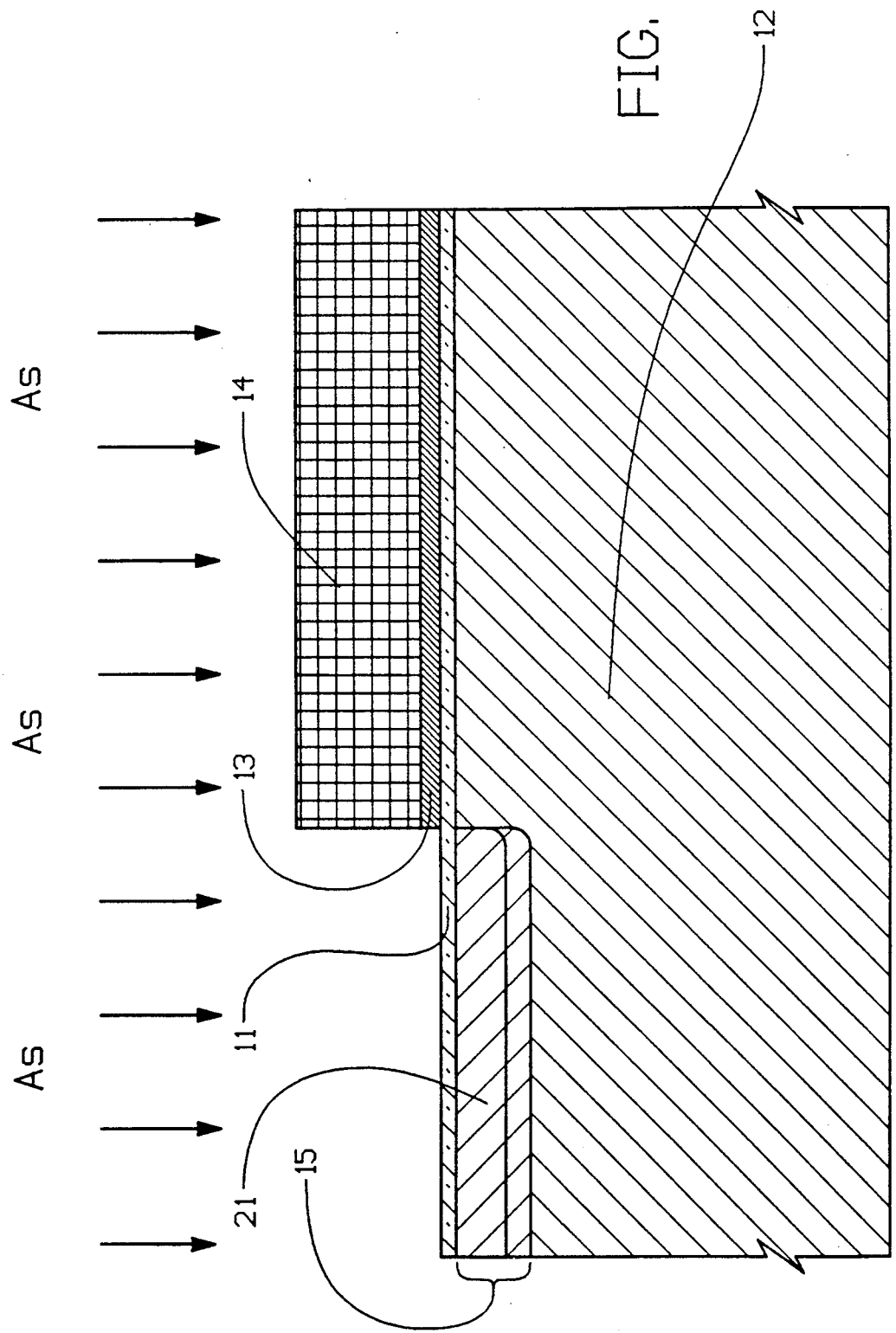
FIG. 2 is a cross-sectional view of the substrate of FIG. 1 following an arsenic P-channel punch-through implant.

Referring now to FIG. 2, the wafer portion processed as shown in FIG. 1 is subjected to an arsenic P-channel punch-through implant, which creates arsenic-implanted punch-through-resistant region 21 within N-well 15.

Figure 3:
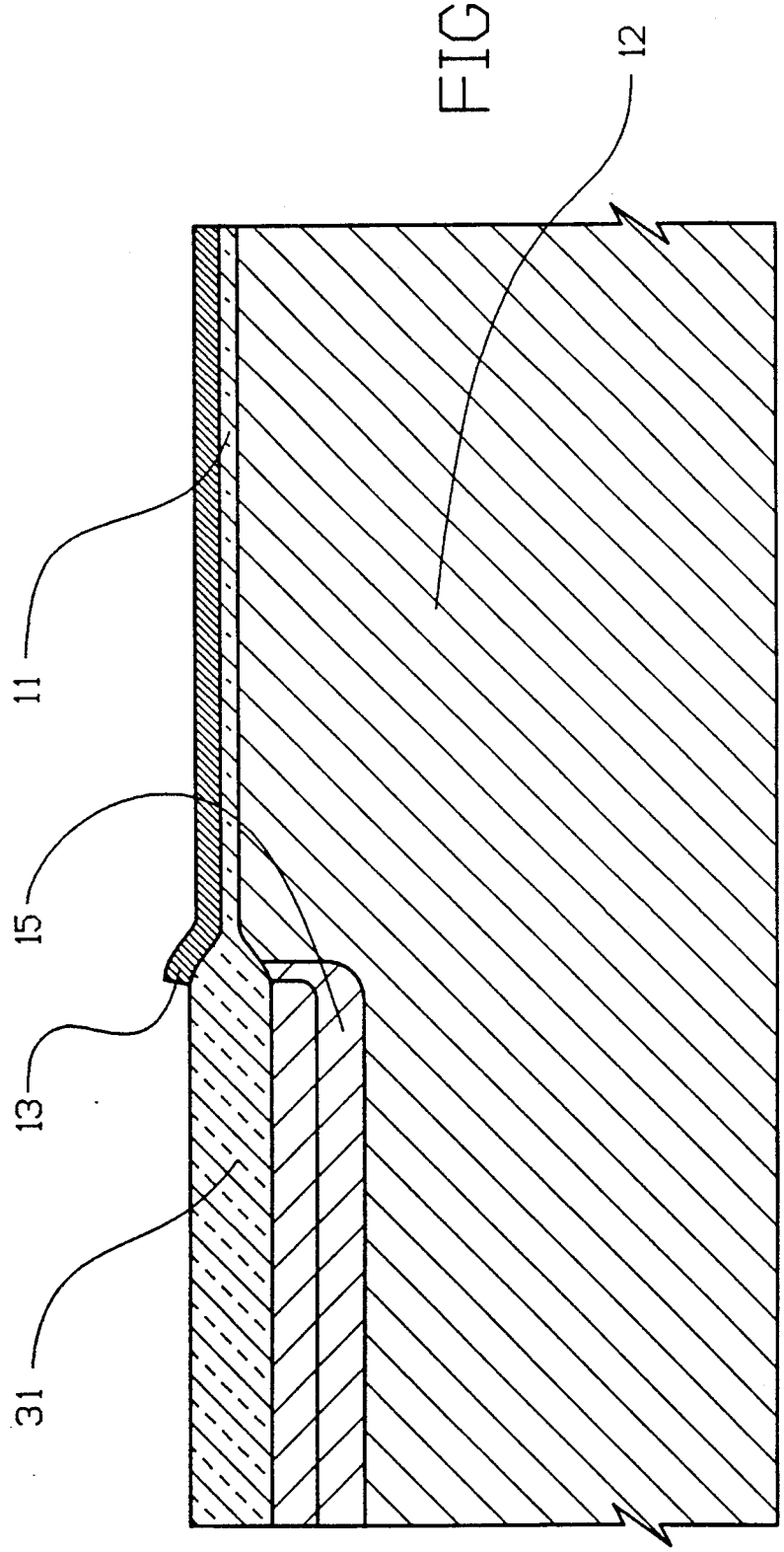
FIG. 3 is a cross-sectional view of the substrate of FIG. 2 following the creation of a silicon dioxide masking layer on top of the N-well region using high-temperature steam oxidation.

Referring now to FIG. 3, the wafer portion processed as shown in FIG. 2 is subjected to a high-temperature steam oxidation step, which creates a silicon dioxide masking layer 31 on top of N-well 15.

Figure 4:
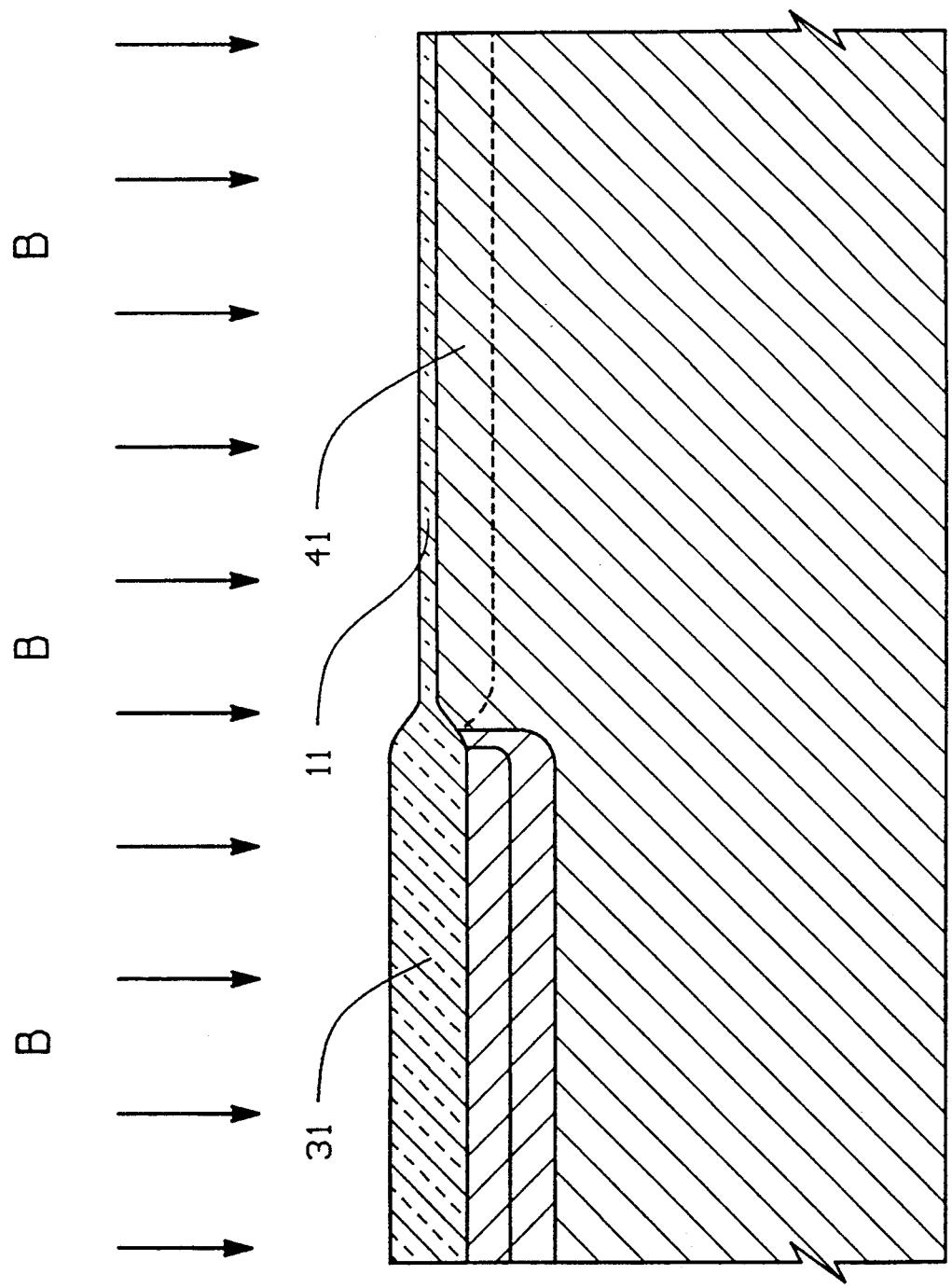
FIG. 4 is a cross-sectional view of the substrate of FIG. 3 following the stripping of the first nitride layer and a boron P-well implant.

Referring now to FIG. 4, first silicon nitride layer 13 has been stripped, and the wafer portion of FIG. 3 is subjected to a boron P-well implant at a dosage level of approximately $4E12/cm^2$ and at an energy of approximately 25kev, which creates P-well 41 in substrate 12.

Figure 5:
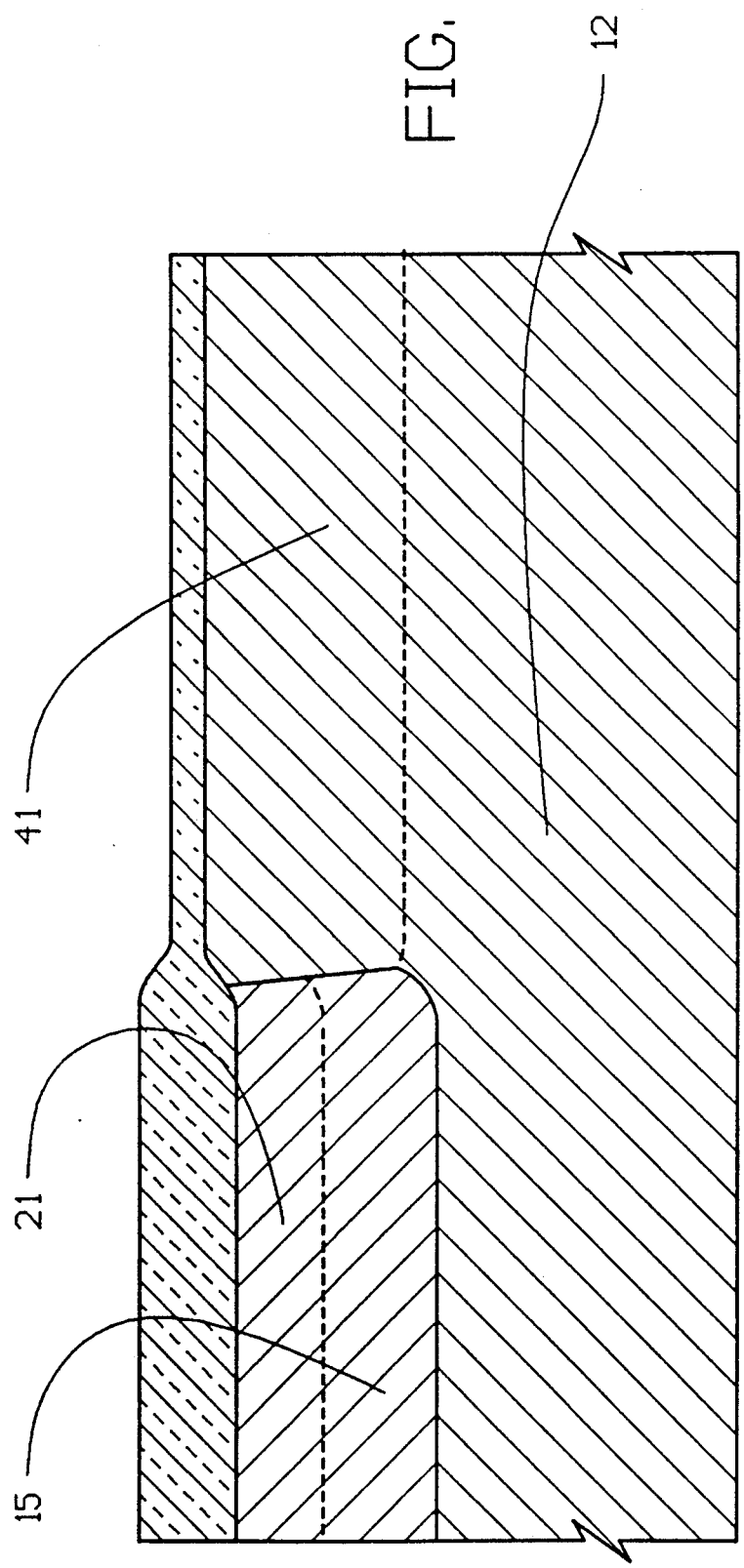
FIG. 5 is a cross-sectional view of the substrate of FIG. 4 following a high-temperature well drive step.

Referring now to FIG. 5, the wafer portion of FIG. 4 is shown following a high-temperature well drive step that causes the phosphorus atoms in N-well 15, and the boron atoms in P-well 41 to diffuse deeper into substrate 12. It will be noted that first pad oxide layer 11 and silicon dioxide masking layer 31 have each increased somewhat in thickness during the high-temperature well drive step.

Figure 6:
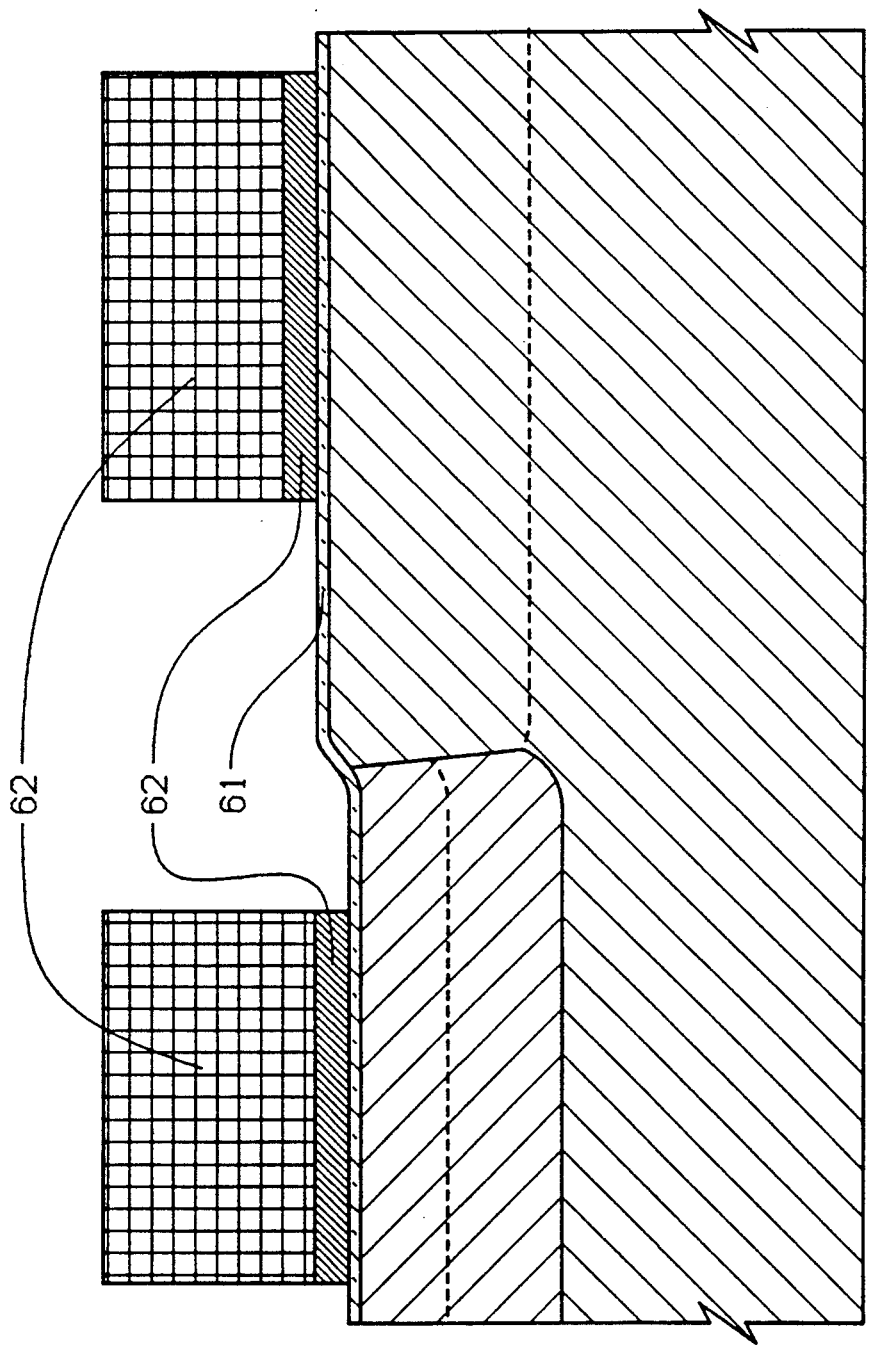
FIG. 6 is a cross-sectional view of the substrate of FIG. 5 following the stripping of the silicon dioxide masking layer and first pad oxide layer, growth of a second pad oxide layer, deposition of a second silicon nitride layer, masking of the second nitride layer with photoresist except where field oxide regions are to be grown, and etching away of exposed portion of the second nitride layer.

Referring now to FIG. 6, the wafer portion of FIG. 5 is prepared for field oxide growth in accordance with conventional LOCOS technology. Silicon dioxide masking layer 31 and first pad oxide layer 11 have been stripped, a second pad oxide layer 61 has been thermally grown, a second silicon nitride layer 62 has been deposited and masked with a second photoresist mask 63 except where field oxide regions are to be grown, and exposed portions of second nitride layer 62 have been etched away.

Figure 7:
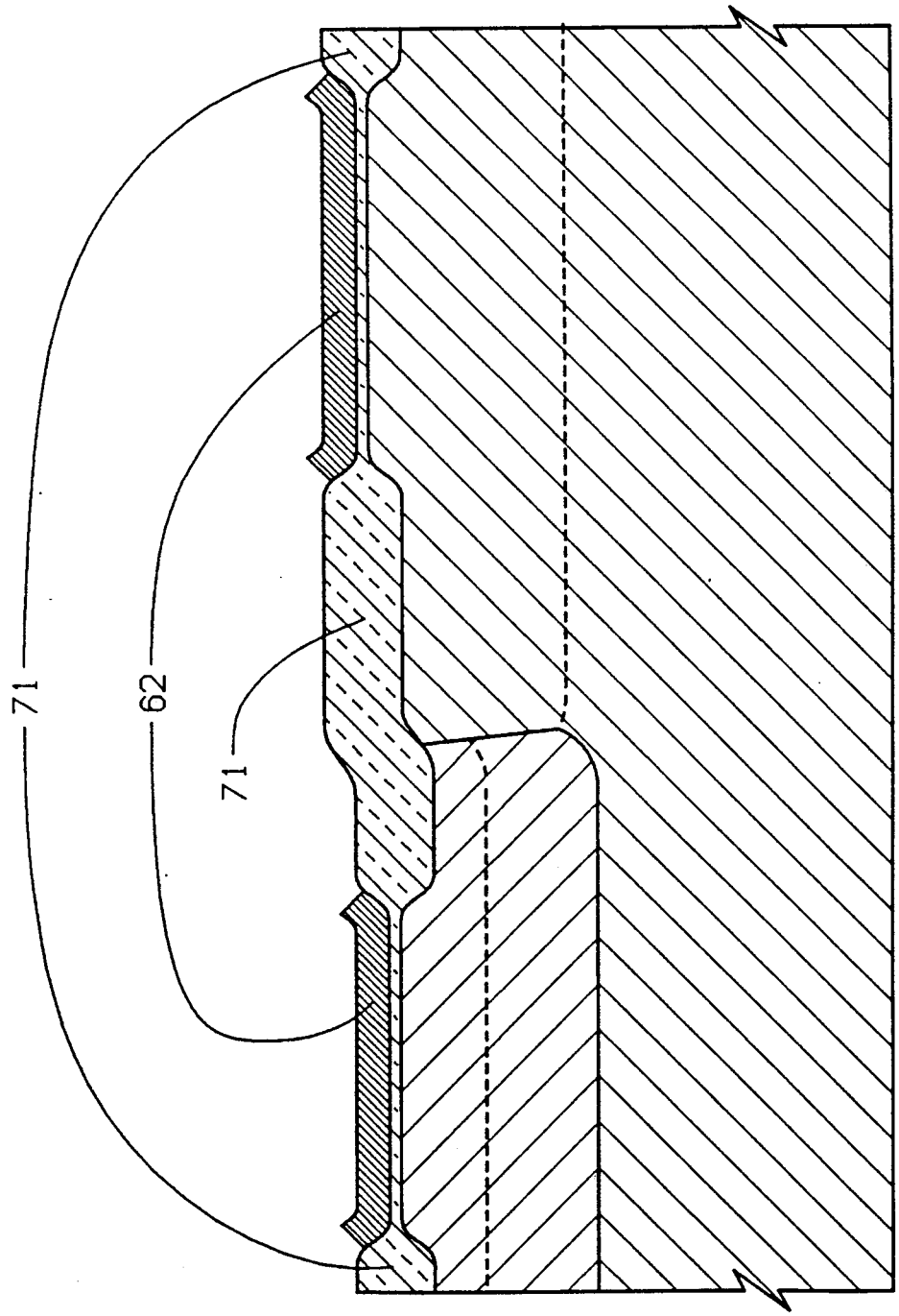
FIG. 7 is a cross-sectional view of the substrate of FIG. 6 following growth of field oxide regions.

Referring now to FIG. 7, the wafer portion of FIG. 6 is shown following the stripping of second photoresist mask 63 and thermal growth of field oxide regions 71.

Figure 8:
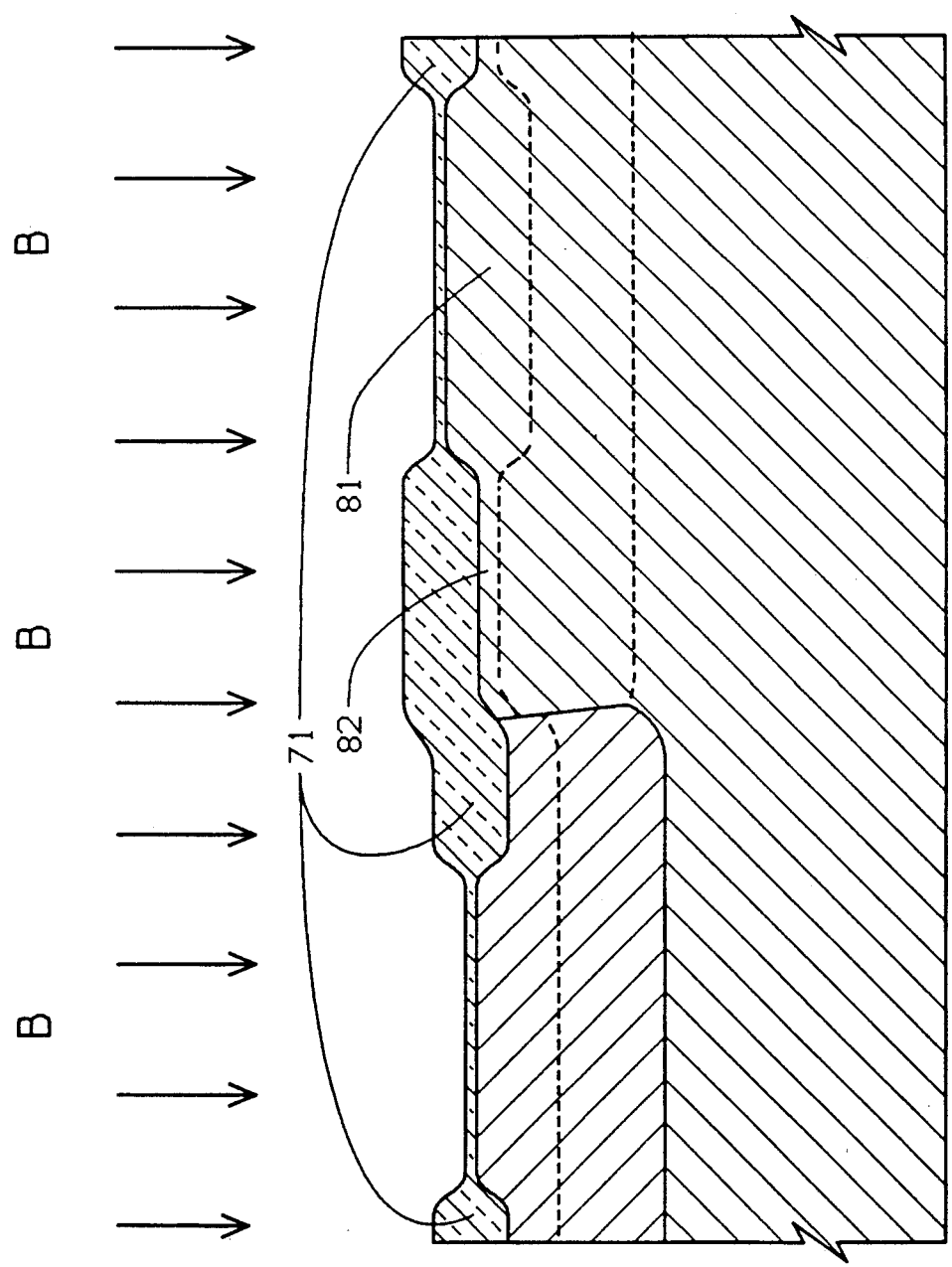
FIG. 8 is a cross-sectional view of the substrate of FIG. 7 following a high-energy boron field-isolation/N-channel punch-through implant.

Referring now to FIG. 8, remaining portions of second silicon nitride layer 62 have been stripped from the wafer portion of FIG. 7, thereafter subjecting it to a high-energy boron field-isolation/N-channel punch-through implant at a dosage level of approximately $5E12/cm^2$ and an energy of approximately 180Kev, which has created punch-through-approxim resistant region 81 and field isolation region 82. It will be noted that the dosage level of the blanket (unmasked) boron punch-through implant has been selected so that counter-doping is an insignificant factor in the N-well regions.

The CMOS circuitry may now be constructed on the wafer, with the channel regions for N-channel devices being implanted such that are superjacent punch-through-resistant regions 81.

Although only a single embodiment of the process has been described, it will be apparent to those having ordinary skill in the art, that changes may be made thereto without departing from the spirit and the scope of the process as claimed.

We claim:

1. A process for preparing a silicon wafer (also referred to as silicon substrate) for submicron CMOS applications comprising the following sequential steps:
    a) creation of a first pad oxide layer on an upper surface of the wafer;
    b) deposition of a first silicon nitride layer on top of the first pad oxide layer;
    c) masking of the first silicon nitride layer in future P-well regions with a first photoresist mask;
    d) etching away those portions of the first nitride layer that are not protected by the first photoresist mask;
    f) subjecting the wafer to an arsenic P-channel punch-through implant;
    g) stripping the first photoresist mask;
    h) creating a silicon dioxide masking layer on top of the N-well regions;
    i) stripping the remaining portions of the first silicon nitride layer;
    j) subjecting the wafer to a boron P-well implant;
    k) subjecting the wafer to a high-temperature well drive step;
    l) strippirg the silicon dioxide masking layer and the first pad oxide layer;
    m) creating a second pad oxide layer on the upper surface of the wafer;
    n) deposition of a second silicon nitride layer on top of the second pad oxide layer;
    o) masking the second silicon nitride layer with a second photoresist mask except where field oxide regions are to be grown;
    p) etching away exposed portions of the second silicon nitride layer;
    q) stripping the second photoresist mask;
    r) thermal growth of field oxide regions;
    s) stripping remaining portions of the second silicon nitride layer; and
    t) subjecting the wafer to an unmasked high-energy boron N-channel punch-through/field-isolation implant.

2. The process for preparing a silicon wafer of claim 1 wherein dosage level of the N-well phosphorus implant is substantially greater than the dosage level of the N-channel punch-through/field-isolation plant so that the counter-doping that occurs in the N-wells as the result of the unmasked punch-through/field-isolation implant does not significantly affect the N-type character of the N-well.

3. The process for preparing a silicon wafer of claim 2 wherein the dosage level of the N-channel punch-through-field-isolation implant is substantially greater than the dosage level of the boron P-well implant.

4. The process for preparing a silicon wafer of claim 3 wherein boron from the punch-through-field-isolation implant is implanted with sufficient energy to locate the majority of the implanted boron atoms below the level of the field oxide regions.

5. The process for preparing a silicon wafer of claim 4 wherein first and second pad oxide layers are thermally grown.

6. A method for creating punch-through-resistant regions for N-channel devices and channel-stop regions beneath field oxide regions for CMOS circuitry constructed on a silicon substrate, wherein said method consists of implanting boron atoms following N-well and P-well formation, and a high-temperature oxidation step which creates said field oxide regions, said implanting being performed in blanket fashion with N-well regions unmasked, and with sufficient energy to penetrate the field oxide regions and create a stratum of high boron atom concentration within the substrate that, in the field oxide regions, is subjacent the field oxide and in N-channel active areas is subject said implanting being performed at concentrations which are insufficient to counter dope the N-type doping within the N-well regions, and then forming N-channel transistor.

* * * * *

UNITED STATES PATENT AND TRADEMARK OFFICE
CERTIFICATE OF CORRECTION

PATENT NO. : 5,024,961
DATED : June 18, 1991
INVENTOR(S) : Ruojia Lee et al

It is certified that error appears in the above-indentified patent and that said Letters Patent is hereby corrected as shown below:

Column 2, line 34 after "regions", kindly insert
-- (also referred to herein as channel-stop regions) --;

Column 3, line 65 delete "approxim"

Column 4, line 24, after "mask;", kindly insert subclaim
-- e) subjecting the wafer to a phosphorous N-well implant --;

Column 4, line 35, delete "strippirg" and insert
-- stripping --;

Column 4, line 56, delete "plant" and insert
-- implant --;

Column 6, line 7, delete "subject" and insert
-- subjacent to N-channel transistors, --.

Signed and Sealed this

Eighth Day of February, 1994

Attest:

BRUCE LEHMAN

Attesting Officer        Commissioner of Patents and Trademarks